United States Patent
Maxwell

(10) Patent No.: US 7,167,038 B2
(45) Date of Patent: Jan. 23, 2007

(54) POWER EFFICIENCY CONTROL OUTPUT BUFFER

(75) Inventor: Christopher T. Maxwell, Sherman, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/719,399

(22) Filed: Nov. 21, 2003

(65) Prior Publication Data

US 2005/0110557 A1 May 26, 2005

(51) Int. Cl.
*H03K 3/00* (2006.01)

(52) U.S. Cl. .................. 327/407; 327/108; 327/112; 326/27; 326/57; 326/82; 326/83

(58) Field of Classification Search ............ 327/108, 327/110, 112, 379, 383, 389, 407, 408; 326/26, 326/27, 30, 83, 86
See application file for complete search history.

(56) References Cited

U.S. PATENT DOCUMENTS

| | | | |
|---|---|---|---|
| 5,165,046 A | * | 11/1992 | Hesson |
| 5,471,150 A | * | 11/1995 | Jung et al. |
| 5,488,322 A | * | 1/1996 | Kaplinsky |
| 5,541,541 A | * | 7/1996 | Salamina et al. |
| 5,610,548 A | * | 3/1997 | Masleid |
| 5,684,410 A | * | 11/1997 | Guo |
| 5,694,065 A | * | 12/1997 | Hamasaki et al. |
| 5,760,620 A | * | 6/1998 | Doluca |
| 5,920,210 A | * | 7/1999 | Kaplinsky |
| 5,929,654 A | * | 7/1999 | Park et al. |
| 6,055,191 A | * | 4/2000 | Sher et al. |
| 6,184,703 B1 | * | 2/2001 | Vest et al. |
| 6,236,245 B1 | * | 5/2001 | Papaliolios |
| 6,388,477 B1 | * | 5/2002 | Juang .................. 327/112 |
| 6,529,050 B1 | * | 3/2003 | Kuo et al. ............ 327/112 |
| 6,781,416 B1 | * | 8/2004 | Nguyen et al. ......... 326/83 |

* cited by examiner

Primary Examiner—Tuan T. Lam
(74) Attorney, Agent, or Firm—William B Kempler; W. James Brady; Frederick J. Telecky, Jr.

(57) ABSTRACT

A power efficiency control circuit eliminates short circuit power consumption associated with a CMOS output buffer in a manner that substantially increases the buffer operating efficiency. The technique is implemented to allow for a reduction of power associated with the output buffer pre-driver stage. The methodology employs a power efficiency control circuit that tri-states the output buffer before every transition.

15 Claims, 3 Drawing Sheets

POWER EFFICIENCY CONTROL OUTPUT BUFFER

BACKGROUND OF THE INVENTION

1. Field of the Invention

This invention relates generally to CMOS output buffers, and more particularly to a power efficiency control circuit that tri-states the output buffer before every transition.

2. Description of the Prior Art

Any CMOS buffer with pull-up/pull-down transistors will consume both dynamic (Idyn) and short circuit (Isc) current. While the dynamic current is unavoidable and is required to drive a capacitive load, the short circuit current is wasted current and should be minimized or even eliminated for low-power operation. The short circuit current is current that is momentarily shorted to ground (instead of being used to charge or discharge the output load) during the middle of any input transition. The short circuit current occurs while both the upper output (UOP) driver and the lower output (LOP) driver are on simultaneously. The short circuit currents reduce the AC performance of the device by 1) increasing the fall and rise time of the output, due to the inability to utilize the full sourcing and sinking current capabilities of the UOP and LOP transistors; and 2) degrading the output signal integrity by inducing ground bounce on adjacent pins.

In view of the foregoing, it would be both beneficial and advantageous to provide a technique for eliminating short circuit power consumption associated with a CMOS output buffer in a manner that substantially increases the buffer operating efficiency. It would be further advantageous if the technique were implemented in a manner allowing for a reduction of power associated with the output buffer pre-driver stage.

SUMMARY OF THE INVENTION

To meet the above and other objectives, the present invention provides a technique for eliminating short circuit power consumption associated with a CMOS output buffer in a manner that substantially increases the buffer operating efficiency. The technique is implemented to allow for a reduction of power associated with the output buffer pre-driver stage. The methodology employs a power efficiency control circuit that tri-states the output buffer before every transition.

According to one embodiment, a power efficiency control (PEC) circuit comprises a plurality of multiplexers (MUXs) having a common input node (IN), an upper output node (UOP) and a lower output node (LOP), wherein the plurality of MUXs are configured such that during an input signal transition at IN, the UOP and the LOP are never on simultaneously.

According to another embodiment, a power efficiency control (PEC) circuit comprises an upper output node (UOP); a lower output node (LOP); a common input node (IN); and means for controlling the UOP and LOP such that during an input signal transition at IN, the UOP and the LOP are never on simultaneously.

According to yet another embodiment, a method of controlling a CMOS buffer having pull-up and pull-down circuitry comprises the steps of providing a multiplexer pre-driver configured to generate a PMOS output signal and an NMOS output signal in response to an input signal; changing an input signal to the multiplexer pre-driver from a first state to a second state; and during the changing input signal, operating the multiplexer pre-driver such that both the PMOS output signal and the NMOS output signal are in a tri-state condition simultaneously.

According to still another embodiment, a power efficiency control (PEC) circuit comprises a first multiplexer circuit operational to generate an upper output (UOP) pre-driver signal in response to an input signal; and a second multiplexer circuit operational to generate a lower output (LOP) pre-driver signal in response to the input signal, wherein the first and second multiplexers are configured such that the UOP pre-driver signal and the LOP pre-driver signal reach their final states at different points in time in response to an input signal transition.

BRIEF DESCRIPTION OF THE DRAWINGS

Other aspects and features of the present invention and many of the attendant advantages of the present invention will be readily appreciated, as the invention becomes better understood by reference to the following detailed description when considered in connection with the accompanying drawing figures thereof and wherein.

While the above-identified drawing figures set forth a particular embodiment, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
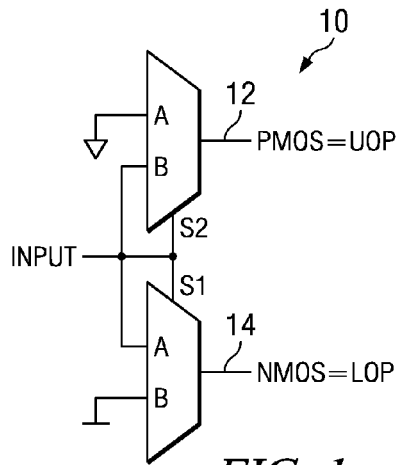
FIG. 1 depicts the logic operation associated with the UOP and LOP for a power efficiency control circuit according to one embodiment.

FIG. 1 depicts the logic operation associated with the UOP (upper output) driver 12 and LOP (lower output) driver 14 for a power efficiency control (PEC) circuit 10. The present inventor alone recognized the key to eliminating short circuit power consumption is to momentarily tri-state the output before every transition. This concept implies the pull-up and pull-down transistors must be driven by independent sources (input Pch=1 while input Nch=0). The power efficiency control circuit 10 to meet this purpose is described in further detail herein below.

Figure 2A:
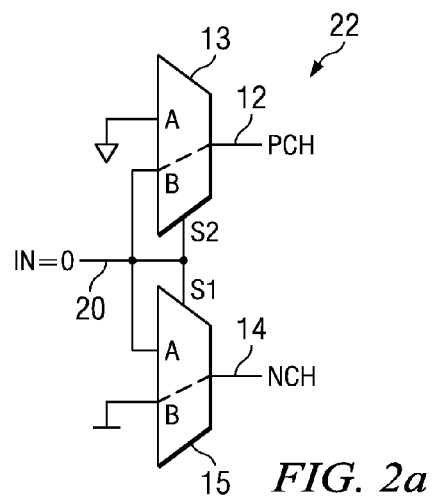
FIGS. 2A–2C illustrate the low-to-high transition of an input signal versus switch connections for the power efficiency control circuit depicted in FIG. 1.

FIGS. 2a, b, c illustrate the low-to-high transition of an input signal versus switch connections for the PEC circuit 10 depicted in FIG. 1. Operation of the PEC circuit 10 is defined in three stages with reference to FIGS. 2a, b, c. Consider now a low-to-high transition on the input 20. FIG. 2a shows the first stage 22 in which input 20 is low. The multiplexers 13, 15 are configured such that Nch 14 is connected to Gnd, while Pch 12 is driven by the input 20.

Figure 2B:
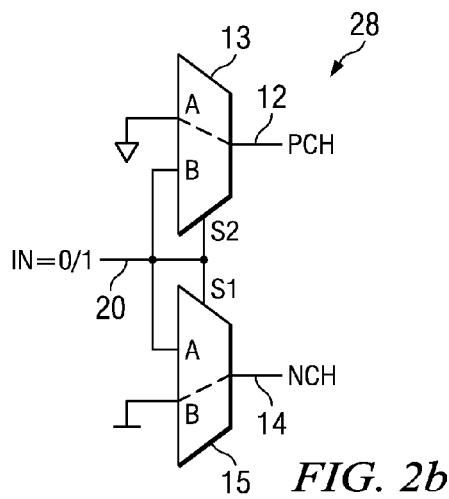

FIG. 2b shows the second stage of operation 28 in which input 20 is in midway through transition. As the input 20 rises from low-to-high, the connection to Pch 12 switches from being driven by input 20 to being pulled-up to Vcc. Nch 14 is still momentarily tied to Gnd. At this point in time, the pull-up and pull-down networks are momentarily tri-stated; and the goal of 'minimal' through current to Gnd is achieved.

Figure 2C:
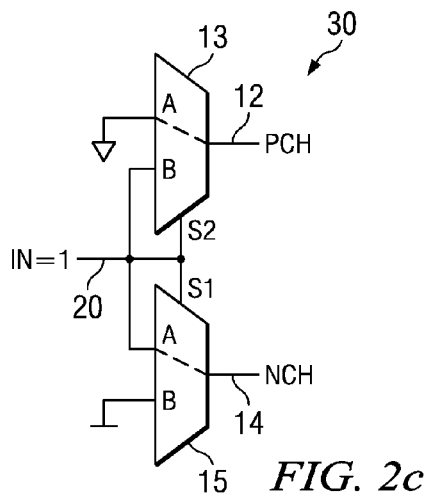

FIG. 2c shows the third stage of operation 30 in which input 20 is high. The multiplexers 13, 15 are now configured such that Pch 12 is being pulled-up to Vcc and Nch 14 is connected to input 20. Pch 12 is pulled-up by Vcc, and therefore rises at a faster rate than Nch 14 that is being pulled-up by input 20, thus guaranteeing that the two are not on simultaneously.

Figure 3:
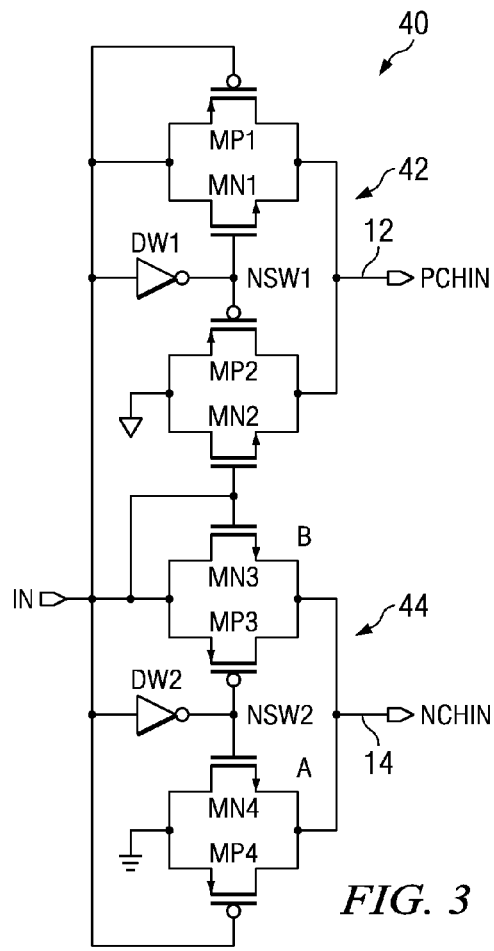
FIG. 3 is a schematic diagram illustrating a MUX pre-driver stage suitable for implementing the power efficiency control circuit shown in FIG. 1 according to one embodiment of the present invention.
Figure 5:
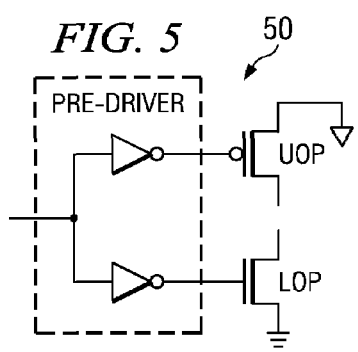
FIG. 5 depicts a common pre-driver implementation.

FIG. 3 is a schematic diagram illustrating a MUX pre-driver stage 40 suitable for implementing the power efficiency control circuit 10 shown in FIG. 1 according to one embodiment of the present invention. The pre-driver stage 40 is implemented using a multiplexer, in contradistinction to most common pre-driver implementations that employ unbalanced sized inverters such as seen in FIG. 5 that depicts a common pre-driver architecture 50. MUX pre-driver stage 40 can be seen to use the output of two series tied multiplexers 42, 44 to control UOP 12 and LOP 14.

Figure 4:
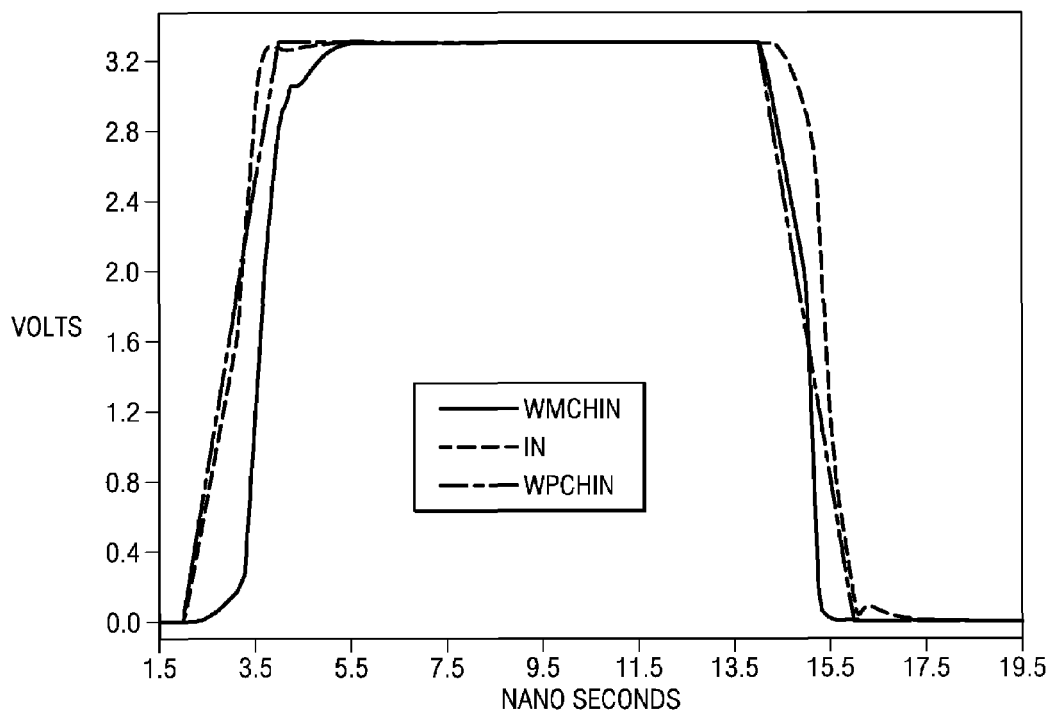
FIG. 4 is a graph depicting simulated plots of MUX functionality for the MUX pre-driver shown in FIG. 3.

FIG. 4 is a graph depicting simulation plots of MUX functionality for the MUX pre-driver stage 40 shown in FIG. 3.

Figure 6:
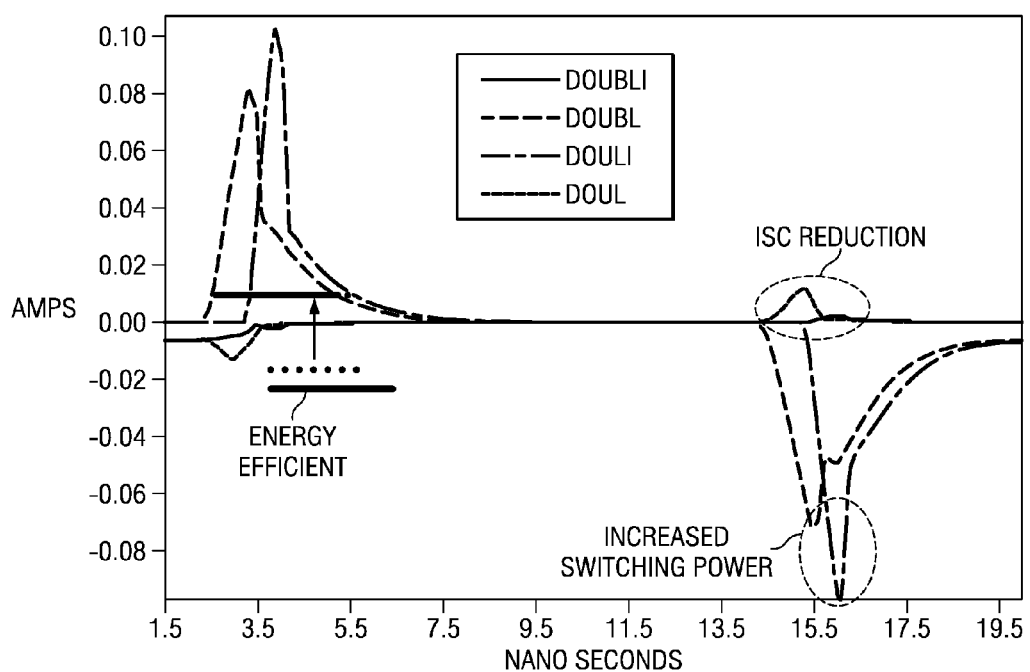
FIG. 6 is a graphic pictorial illustrating the transfer of short circuit current to dynamic drive current according to one embodiment.

MUX pre-driver stage 40 was found by the present inventor to reduce the short circuit current in a test device simulation design by 84%, consequently increasing the amount of dynamic current available for switching the output by as much as approximately 35%. FIG. 6 is a graphic pictorial illustrating the transfer of short circuit current to dynamic drive current using the MUX pre-driver stage 40 to implement the PEC circuit 10. The simulation revealed the total power was decreased because the short circuit current gain was transferred to the dynamic current used to switch the output. This current transfer was found however, to improve the efficiency of the power usage with the output cell.

Figure 7:
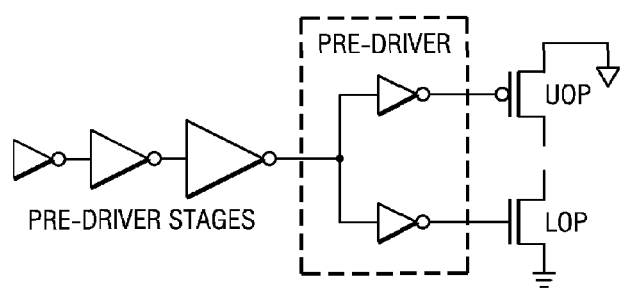
FIG. 7 illustrates a typical pre-driver stage that is not required with the MUX pre-driver shown in FIG. 3.

Another benefit provided by the use of MUX pre-driver stage 40 was discovered by the inventor to be a reduction of power in the pre-driver stage 40. In most CMOS buffers with a pull-up/pull-down network, a pre-driver stage (usually consisting of a cascaded inverter chain) is placed between the core logic and output stage. FIG. 7 illustrates a typical pre-driver stage that is not required with the MUX pre-driver 40 shown in FIG. 3. The size of each inverter in the chain is usually scaled up in size (from first to last inverter) in order of magnitude e for optimum performance to drive a large capacitive load. The signal driving the inverter chain usually has a slow slew rate of approximately 1.5–7.5V/ns (relative to the size of the local transistors), and increases to a sharp edge rate equal to or greater than approximately 15V/ns (as the transistor sizes increase), to drive the final stage. This sharp edge rate is normally required to minimize the amount of short circuit current in the final stage by reducing the amount of time the pull-up/pull-down network is on simultaneously. The PEC input 20 does not require a sharp edge to minimize the short circuit current in the final stage, but by design eliminates the short circuit current in the pull-up/pull-down network edge rates as slow as 1.7V/ns. This eliminates the need for a long, perfectly scaled inverter chain (depending on speed requirements); and a large portion of the inverter chain may be eliminated. The power consumption of the pre-driver stage is (for many CMOS devices) a large portion of the total power consumed. Reducing the size of the pre-driver stage consequently reduces the total power as well.

Figure 8:
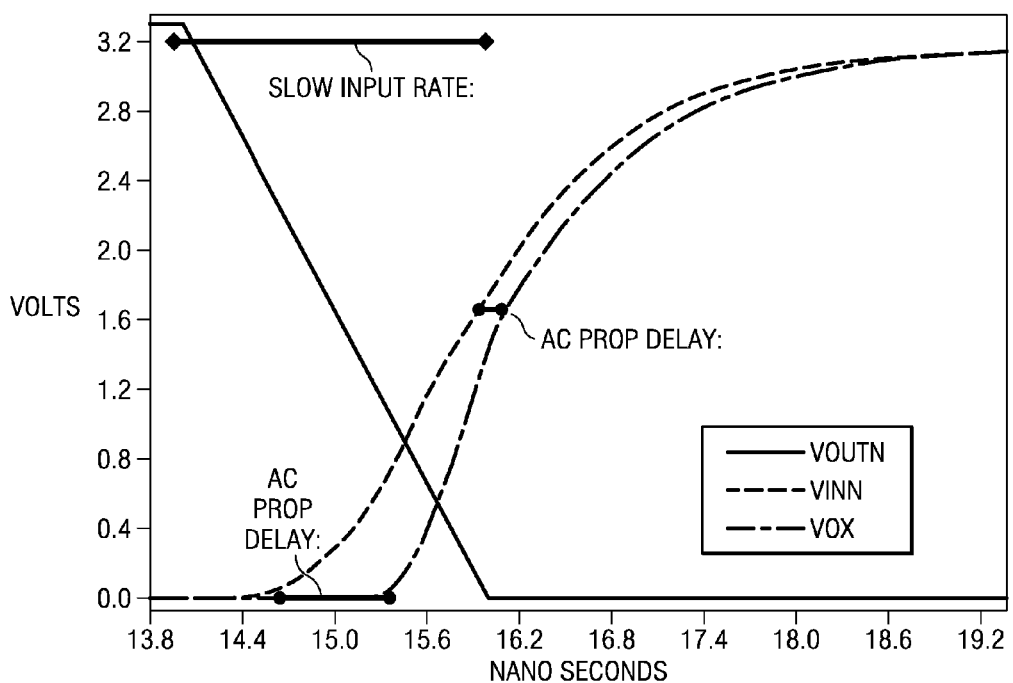
FIG. 8 is a graph depicting a set of plots illustrating lower power consumption without the loss of speed associated with the MUX pre-driver shown in FIG. 3.

The PEC 10 implemented via MUX pre-driver 40 was found by the present inventor to increase the through delay of the output cell by approximately 100–150 ps. The rise and fall output edges pull-down the transistor network. The additional dynamic current gained from the short circuit current reduction improved the transition speed of the output. Because the rise and fall time edges improved, the delay (between input to output) experienced at the beginning of each transition was minimized at the point Tpd reference, thus the 100–150 ps delay. FIG. 8 is a graph depicting a set of plots illustrating lower power consumption without the loss of speed associated with the MUX pre-driver 40 shown in FIG. 3.

Those skilled in the art will appreciate the ground bounce induced noise available in all CMOS buffers can be directly attributed (in part) to the short circuit current in each output. In a low-to-high output transition, for example, the supply current should all flow from Vcc through the output load to Gnd. The short circuit current however, flows through the device's internal Gnd, across package parasitic inductances, to the external Gnd. Minimizing the amount of current flow through the internal Gnd will directly reduce the amount of ground bounce seen in the output. Reducing the short circuit current flow during a transition consequently reduces the short circuit current component of the Gnd current as well, and thus reduces the noise on non-switching pins (i.e. quiet pins) for the device.

In view of the above, it can be seen the present invention presents a significant advancement in the art of CMOS buffer technology. Further, this invention has been described in considerable detail in order to provide those skilled in the output buffer circuit art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A power efficiency control (PEC) circuit comprising a plurality of multiplexers (MUXs) having a common input node (IN) for receiving a single input signal for driving both the UOP and LOP, an upper output node (UOP) and a lower output node (LOP), wherein the plurality of MUXs are configured to generate output signals at UOP and LOP in response to only the input signal at IN such that during an input signal transition at IN, a control electrode for the UOP and the LOP are driven towards opposite voltage supplies so that the UOP and the LOP are never on simultaneously.

2. A power efficiency control (PEG) circuit comprising a plurality of multiplexers (MUXs) having a common input node (IN) for receiving a single input signal for driving both the UOP and LOP, an upper output node (UOP) and a lower output node (LOP), wherein the plurality of MUXs are configured to generate output signals at UOP and LOP in response to only the input signal at IN such that during an input signal transition at IN, the UOP and the LOP are never on simultaneously, wherein the plurality of MUXs is configured to put the UOP and LOP simultaneously in a tri-state condition solely during the input signal transition.

3. The PEG circuit according to claim 2, wherein the output signals at UOP and LOP are CMOS compatible output pre-driver signals.

4. The PEC circuit according to claim 2, wherein the plurality of MUXs are further configured as a pre-driver stage comprising a CMOS UOP pre-driver and a CMOS LOP pre-driver.

5. The PEG circuit according to claim 4, wherein the CMOS UOP pre-driver comprises a MUX to control a PMOS transistor in the UOP and the CMOS LOP pre-driver comprises an MUX to control a NMOS transistor in the LOP.

6. The PEG circuit according to claim 2, wherein the plurality of MUXs are further configured such that during an input signal transition at IN, the output signal at UOP and the output signal at LOP reach their final states at different points in time.

7. A power efficiency control (PEC) circuit comprising:
an upper output node (UOP);
a lower output node (LOP);
a common input node (IN) for receiving a single input signal for driving both the UOP and LOP; and
means for controlling the UOP and LOP in response only to the input signal such that during a transition of the input signal at IN, a control electrode for the UOP and the LOP are driven toward opposite voltage supplies so that the UOP and the LOP are never on simultaneously.

8. A power efficiency control (PEC) circuit comprising:
an upper output node (UOP);
a lower output node (LOP);
a common input node (IN) for receiving a single input signal for driving both the UOP and LOP; and
means for controlling the UOP and LOP in response only to the input signal such that during a transition of the input signal at IN, the UOP and the LOP are never on simultaneously, wherein the means for controlling the UOP and LOP is operational to configure both the UOP and LOP to be in a tri-state condition solely during the input signal transition.

9. The PEG circuit according to claim 8, wherein the means for controlling the UOP and LOP comprises a CMOS UOP pre-driver stage and a CMOS LOP pre-driver stage.

10. The PEC circuit according to claim 9, wherein the CMOS UOP pre-driver stage comprises a multiplexer to control a PMOS transistor in the UOP and the CMOS LOP pre-driver stage comprises a multiplexer to control a NMOS transistor in the LOP.

11. A method of controlling a CMOS buffer having pull-up and pull-down circuitry, the method comprising the steps of:
providing a multiplexer pre-driver configured to generate a PMOS output signal and an NMOS output signal in response to only a single input signal for generating both the PMOS output signal and NMOS output signal;
changing an input signal to the multiplexer pre-driver from a first state to a second state; and
during the changing input signal, operating the multiplexer pre-driver such that both the PMOS output signal and the NMOS output signal are in a tri-state condition simultaneously.

12. The method according to claim 11, wherein during the changing input signal, operating the multiplexer pre-driver further causes the PMOS output signal and the NMOS output signal to reach their final states at different points in time.

13. A power efficiency control (PEC) circuit comprising:
a first multiplexer circuit operational to generate an upper output (UOP) pre-driver signal in response to only an input signal; and
a second multiplexer circuit operational to generate a lower output (LOP) pre-driver signal in response to only the input signal, wherein the input signal is a single input signal for generating both the UOP and LOP pre-driver signals and the first and second multiplexers are configured such that the UOP pre-driver signal and the LOP pre-driver signal reach their final states at different points in time in response to an input signal transition wherein the first and second multiplexers are further configured such that the UOP pre-driver signal and the LOP pre-driver signal are simultaneously tri-stated during the input signal transition.

14. The PEC circuit according to claim 13, wherein the UOP pre-driver signal is a PMOS signal.

15. The PEC circuit according to claim 13, wherein the LOP pre-driver signal is an NMOS signal.

\* \* \* \* \*